United States Patent [19]

Lucas

[11] 3,769,895

[45] Nov. 6, 1973

[54] MASKING FOR PRINTED CIRCUIT PHOTOMASTERS

[75] Inventor: George J. Lucas, Norridge, Ill.

[73] Assignee: Teletype Corporation, Skokie, Ill.

[22] Filed: June 9, 1971

[21] Appl. No.: 151,335

[52] U.S. Cl. ............................... 95/85, 40/2, 96/27, 161/6, 355/40

[51] Int. Cl. ............................... G03b 15/00

[58] Field of Search ............................... 95/85; 33/174; 96/27; 40/2; 161/6; 355/40, 77

[56] References Cited

UNITED STATES PATENTS 2,970,043 1/1961 Serafin ............................... 95/85 X 3,233,509 2/1966 Swiggett ............................... 355/77

*Primary Examiner*—Samuel S. Matthews
*Assistant Examiner*—Richard A. Wintercorn
*Attorney*—J. L. Landis and J. B. Hoofnagle, Jr.

[57] ABSTRACT

A pad to represent a land area on a photomaster for printed circuit patterns has a set of orthogonal indicators to locate the pad with respect to an underlying rectangular grid pattern. The pad also has a center mark to facilitate referencing to the center of the pad for programming drills or the like once the pad has been incorporated into the pattern of the photomaster.

9 Claims, 6 Drawing Figures

PATENTED NOV 6 1973 3,769,895

INVENTOR
GEORGE J. LUCAS

BY [signature]

ATTORNEY

MASKING FOR PRINTED CIRCUIT PHOTOMASTERS

FIELD OF THE INVENTION

The invention relates to masking pads useful in producing photomasters for manufacturing printed circuit boards, and more particularly, this invention is concerned with an adhesive opaque element which has a defined center and discernible indicators to allow precise positioning of the element on the photomaster with respect to an underlying, orthogonal grid system.

TECHNICAL CONSIDERATION AND DESCRIPTION OF PRIOR ART

A conductive pattern on printed circuit boards is commonly produced by selectively etching conductive area films or layers on one or both sides of a dielectric board. An etch resistant pattern is photochemically generated on the conductive surface layer of the board by use of photographic masking techniques. The masking pattern is initially generated on what is commonly called an "art master" or a "photomaster."

The photomaster usually comprises a transparent or translucent base sheet, to which opaque, adhesive-coated patterns, called "pads" or "labels," are attached, representing land areas for terminal or connection pads. Opaque interconnecting strips or tapes are added to delineate the intended circuit. One prior-known process of this type is disclosed in R. L. Johnston et al. U.S. Pat. No. 3,169,063, granted on Feb. 9, 1965, herein incorporated by reference.

An important aspect of this process is to precisely locate the pads with respect to each other on the transparent base sheet, particularly where two art masters are formed, for making different circuits on opposite sides of the printed-circuit board. These are called "two-sided" boards, and it is critical that portions of the circuit on each side register precisely with portions on the other side; thus, the pads on each art master must be precisely located with respect to reference points on the base sheets. One common practice, a form of which is disclosed in the Johnston et al. patent is to provide a reference, orthogonal grid of intersecting lines on the base sheet, with respect to which the pads can be aligned. Each pad in turn is positioned on the base sheet by centering the pad over a selected intersection of two of the mutually perpendicular grid lines, like cross-hairs, and then adhesively adhering the pad to the base sheet. In the manufacture of printed-wiring boards, holes in the board are customarily located according to where the pad should be on the grid pattern; therefore, accurate pad placement is essential. In the Johnston et al. patent, each pad has a centering hole, which contains a window having two lines intersecting at right angles in the center of the hole. To position this type of pad on the base sheet, the intersecting lines in the window are aligned with selected intersecting lines on the underlying grid system.

This photomaster, which is a composite of the pads and interconnecting strips, is photographed in actual or reduced size to produce a mask which is either a positive or negative representation of the desired circuit pattern. When a negative mask of the desired circuit pattern is used, there are opaque areas formed which represent the centering holes of the pads used to make the photomaster. The mask is then placed over a photosensitive coating on a metal-clad substrate. Upon subjection to light, the photosensitive material is set in the outline of the desired circuit pattern. However, the opaque centering hole areas preclude the setting of underlying areas in the circuit pattern. The substrate is washed to remove the unset photoresist and then immersed in an etching solution to remove the unwanted metal. At this time, the etchant acts on the areas representing the centering holes so that small holes appear in the desired circuit pattern.

SUMMARY OF THE INVENTION

The present invention contemplates pad structures for masking photomasters, wherein the pads are provided with indicators for alignment with grid lines on an underlying sheet and/or center-locating facilities which pass insufficient light to interfere with the subsequent etch processing of the boards. In one instance the indicators are formed on the periphery of the pad, e.g., as indentations or projections. In another instance the indicators are provided by angular extremities of a small centering hole. In a further embodiment, the pad is positioned and centered by viewing the grid lines through a small amber window. In use of any of those pads, photomasters are produced which permit the subsequent fabrication of circuit patterns, such as terminal pads or through-hole connections, without the etch formation of detrimental pin holes.

Other features of the invention, as well as objects and advantages, will become apparent by reference to the following detailed description and the drawings illustrating specific embodiments of the invention.

DETAILED DESCRIPTION

Figure 1:
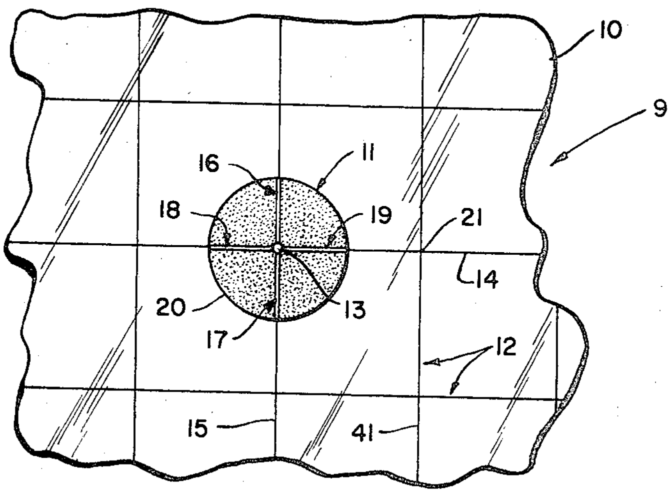
FIG. 1 shows an opaque land-area masking pad positioned on a portion of a transparent or translucent base sheet, having a grid pattern associated with it, for use as a photomaster in printed circuit manufacture.

Referring to FIG. 1, there is shown a portion of an art master 9 at an initial stage in the process of formation. The art master includes a base sheet 10 of a transparent or translucent material, to which masking elements or "pads" 11, in accordance with a first embodiment of this invention, are to be attached in precisely selected positions. Typically, the base sheet 10 is formed of a clear plastic, such as a polyester film. An orthogonal grid system of lines 12 is provided by a grid pattern underlying the base sheet 10 or the lines 12 can be formed directly on the base sheet 10 but in a color or shade that will not reproduce photographically. Therefore, the system of grid lines 12 can be "dropped out" or eliminated in subsequent photographic operations. The lines 12 are used for precisely locating the pads 11 and tapes (not shown) used in constructing the art master.

The pads 11 are cut from an opaque material, such as black crepe, and are adhesive-coated for adherence to the base sheet 10 at the prescribed locations. Since the pads 11 are opaque, the grid system 12 cannot be seen through the pad. In this embodiment, a very small aperture or hole 13 defines the center of the pad 11. For reasons which will be discussed later, this hole 13 is intentionally made so small that it cannot be used in positioning the pad 11 with its center over intersecting lines 12 of the underlying grid system. A typical intersection point as, for example, point 21 is not discernible through the hole 13, consequently the masking pad 11 cannot accurately be positioned via the hole 13 in its intended location with respect to the grid system.

To position the pad 11 accurately over the intersection of a line 14 and an orthogonal line 15 of the grid lines 12 the upper surface of pad 11 is equipped with two pairs of visible or discernible indicators, 16–17 and 18–19. These sets of indicators are shown in this particular embodiment as indicator lines 16 and 17 located diametrically opposed from each other across the center of pad 11 as defined by the hole 13 and indicator lines 18 and 19, which are perpendicularly oriented with respect to indicator lines 16 and 17, and also diametrically opposed from each other across the center of the pad 11 as also defined by hole 13. Each one of these indicator lines 16, 17, 18 and 19 is a straight line extending from the hole 13 to the periphery 20 of element 11. The indicator lines 16, 17, 18 and 19 are preferably formed on the pad 11 by ruling or scoring the pad 11 during its manufacture.

By aligning indicator lines 16 and 17 coextensively with the visible portions of the line 15, for example, and by aligning indicator lines 18 and 19 coextensively with portions of the line 14 showing beyond the periphery 20 of the pad 11, pad 11 can be positioned with the hole 13 directly over the intersection of lines 14 and 15. By aligning the masking pad 11 in this manner, the hole 13 is not needed for ascertaining the correct position of element 11 and is omitted in some embodiments. The purpose of the small hole 13, when used, will be explained later in connection with FIG. 6. Once the masking pad 11 is positioned, its adhesive-coated lower surface is pressed onto the base sheet 10 to cause the masking pad 11 to adhere to the base sheet.

Figure 2:
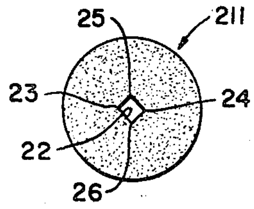
FIGS. 2–5 inclusive, show alternative embodiments of the masking pad of FIG. 1.

The above description of the masking pad 11 represents only one specific embodiment within the scope of the invention. Variations of the masking pad in FIG. 2 through FIG. 5 show different embodiments of the indicators and means for defining the "center" of the masking pad. In FIG. 2 the center of the pad, 211, is defined by a square aperture 22. Opposite corners 23–24, and 25–26, respectively, represent a pair of indicators for centering the pad 211 over a selected grid line intersection 21. This particular arrangement of the indicators forming corners 23, 24, 25 and 26 of the aperture 22 requires that the pad 211 be centered through the aperture. Consequently the aperture 22 has to be larger in area than the hole 13 in FIG. 1.

To further prevent light from entering through the aperture 22, a window which is opaque to light of all but one color and transparent to light of that one color is inserted into the aperture 22. The pad 211 can thus be centered through the aperture 22 with respect to an intersection of any two grid lines 12, by aligning the corners of the aperture 22, representing indicators 23, 24, 25 and 26, with the selected grid lines. Light of the one color with respect to which the window is transparent renders underlying grid lines and their intersection 21 visible for alignment.

In a later photographic process for producing circuit boards, light is used which does not contain the color with respect to which the window in the aperture 22 is transparent. Thus, the aperture 22 is virtually opaque or non-existent with respect to the light used in the photographic process.

Figure 3:
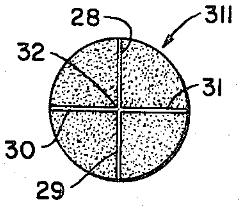

In FIG. 3, the pad 311 illustrates another variation of the indicators in the form of discernible lines on the upper surface of element 11. The indicator lines 28 and 29 are linearly coextensive of each other, and the indicator lines 30 and 31 are linearly coextensive of each other and perpendicular to the indicator lines 28 and 29. Thus, the two sets of indicator lines 28–29 and 30–31 form a visible cross-hair-like pattern on the surface of the pad 311. Each indicator line extends from the periphery of element 311 to a common junction point on the pad 311. The junction point 32 of the indicators defines the "center" of the pad 311. Centering of the pad 11 having the described indicator pattern of indicator lines 28, 29, 30 and 31, with respect to the orthogonal grid system 12 is substantially the same as centering the pad 11 with indicators 16, 17, 18 and 19 shown in FIG. 1.

Figures 4, 5:
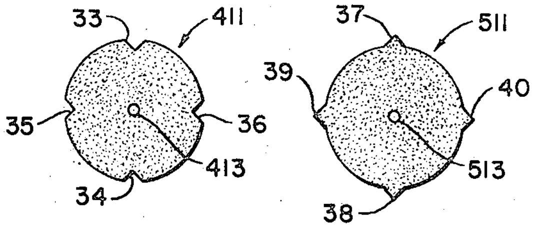

In FIGS. 4 and 5, holes 413 and 513 define the centers of the pads 411 and 511, Indicators 33–40 are V-shaped modifications of the periphery of each pad. FIG. 4 shows V-shaped notches 33, 34, 35 and 36 spaced at right angles to each other with respect to the center 413 along the periphery of the pad. The notch 33 is located diametrically opposed from the center hole 413 with respect to the notch 34 and the notch 35 is located diametrically opposed from the center hole 413 with respect to the notch 36. It will be apparent that only three projections are needed accurately to position the pad on a rectangular grid. FIG. 5 similarly shows V-shaped protrusions from the periphery of the pad 511. The protrusion 37 is diametrically opposed from the center hole 513 with respect to the protrusion 38, as is the protrusion 39 with respect to the protrusion 40. The notches 33–36 can be filled with the same material as the window 22 of FIG. 2; similarly, the protrusions 37–40 can be made of a photographically transparent material, in order to maintain a smooth periphery of the pad 511 and the pad 411.

To align pads having indicators as shown in FIG. 4 or FIG. 5 with a coordinate grid intersection such as 21, the pad is located such that a pair of diametrically opposed indicators is centered over a first selected grid line (for example, line 14) and the other paid of indicators is centered over a selected grid line (for example, line 41) perpendicular to the first selected line. This necessarily locates the center hole 413 and 513 of the element directly over the selected intersection point of the grid lines, such as the intersection 21 in FIG. 1.

In all embodiments of the masking pad the area has been shown and described as being circular. This, however, is not a requirement for a masking element within the scope of this invention. A masking element may have any convenient shape, as the particular design of the photomaster requires, as long as the shape permits the defining of a point on the masking element and the placing of discernible indicators orthogonal to each other with respect to the defined point.

The masking pad or element thus described is used, either directly or indirectly, in masking a land or terminal area on a conductively-clad, dielectric circuit board during the photographic exposure of the previously-sensitized conductive layer of the circuit board during the generation of a circuit pattern. The art master 9 is produced, usually on an enlarged scale, for example, four times the size of the finished circuit board. The land areas are designated either for representing areas to accept electrical components in the finished circuit pattern or to form the terminal land of a through-hole connection. The masking pads or elements 11 are placed on the base sheet 10 and located in their exact positions by reference to the underlying grid pattern as previously described. The appropriate connections between the land areas are made by commonly-known methods using opaque pressure sensitive tape to complete the art master 9 for one side of the circuit board, generally as described in the abovementioned Johnston et al. patent. By a similar process an art master for the other side of the circuit board is then produced.

To ascertain the exact positions of the masking elements 11 with respect to each other and with respect to reference points (not shown) on the base sheet 10, the art master 9 is then placed on a machine for ascertaining and recording the coordinates of the centers of the elements. This type of machine is commonly known in the art as a digitizer (not shown). The information obtained from the digitizer is used in making a blank for a double sided circuit board. This step is most easily explained by reference to FIG. 6 of the drawing, showing a cross-section through a portion of a circuit board 44 during photographic exposure. A dielectric base material 45 is cut to the appropriate size as required for the finished circuit board. It is, of course, possible to cut the base material 45 to a size which is a multiple of the intended board size and produce a repetitive board pattern on the larger base material 45 which is in the end separated into several circuit boards. The following steps are described for a single circuit board, but are applicable to a repetitive pattern for several boards as well.

After cutting the base material to its correct size, holes are formed by drilling or punching or by other means through the base material 45 in locations where through-hole connections are to be made. Such a hole is shown and designated 46. The information as to where this hole 46 is to be located on the circuit board 44 is taken from the digitizer which obtains the information from the four-times-size art master 9.

The location of the hole 46 will then be in axial alignment with an opaque area or masking pad 611 on a contact transparency 47. The opaque pad 611 is either identical with, or a replica of, the masking pad or element 11 of FIG. 1. The entire contact transparency 47 is either identical with, or a photographically produced replica of the art master 9 either to the exact size of the art master 9 or to a predetermined, reduced scale, usually one-quarter size. After all holes 46 have been formed through the base material 45, the base material 45 is uniformly clad with a layer 48 of conductive material on all surfaces of the base material 45. The layer can be applied by any known plating process or other known method in the art. The conductive layer extends through the holes 46 such that a conductive connection 49 is made through each hole 46 in the dielectric base material 45.

This conductive layer 48 and 49 is then photosensitized such that areas of the conductive layer exposed to light after sensitization can be etched away. Areas which are shielded as by an opaque area or masking pad 611 during the step of photographic exposure are thus made resistant to the etching process to form conductive areas on the base material 45 by conventional printed-wiring techniques. A photographic exposure-etching method wherein the unexposed portions of a conductive layer are etched away is alternatively within the scope of this invention. A photographic negative of the art master 9 used to mask the conductive surfaces 48 and 49 during the photographic exposure can then achieve the same result.

Figure 6:
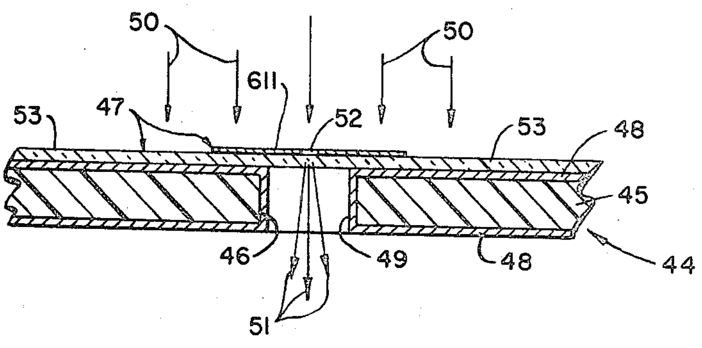
FIG. 6 is a cross-sectional view of a copper-clad laminate showing a photoresist emulsion being selectively exposed to light through a mask made according to the present invention.

As shown in FIG. 6, the opaque area or masking pads 611 of the contact transparency 47 will prevent light (as shown by the arrows 50) from exposing the area under the opaque pad 611. A small amount of light (as shown by the arrows 51) entering through the center hole 52 in the opaque pad 611 is ineffective in exposing the surface 49 of the conductive layer, even though some scattering of light may take place. As a result, the conductive layer 49 will not be etched away in a subsequent etching process. The portions of the conductive surface 48 that are under transparent areas 53 of the contact transparency 47 are outside of the area shielded by the opaque pad 611 and are etched away to leave the desired printed circuit pattern according to the art master 9.

Although various specific embodiments of the invention are shown in the drawings and described in the foregoing specificastion, it will be understood that invention is not limited to the specific embodiments described, but is capable of modification and rearrangement and substitution of parts and elements without departing from the spirit and scope of the invention.

What is claimed is:

1. An element for attachment to an art master base sheet having orthogonal grid lines for locating the element, which comprises:

an opaque pad having means for defining a reference point on the pad, said defining means being incapable of passing significant quantities of illumination, and having two sets of indicators, each set of indicators being located at ends of a line through the reference point on the pad, and the location line of each set being orthogonal to the line of the other set, for aligning the pad with respect to the orthogonal grid lines, the means for defining the reference point on the pad being an aperture through the pad having a size substantially precluding the passage of light in the opaque area of the mask delineated by the element on the art master, and each set of indicators being a pair of discernible straight lines on the pad, each line extending from the aperture to the periphery of the pad; and means for attaching the pad to the base sheet to form an art master.

2. An element as defined in claim 1, wherein each pair of visible lines is a scribe line.

3. An element for attachment to an art master base sheet having orthogonal grid lines for locating the element, which comprises:

an opaque pad having means for defining a reference point on the pad, said defining means being incapable of passing significant quantities of illumination, and having two sets of indicators, each set of indicators being located at ends of a line through the reference point on the pad, and the location line of each set being orthogonal to the line of the other set, for aligning the pad with respect to the orthogonal grid lines, each indicator being a discernible straight line on the pad extending from the periphery of the pad toward a common junction on the pad, and the means for defining the reference point of the pad being the junction of the lines; and means for attaching the pad to the base sheet to form an art master.

4. An element for attachment to an art master base sheet having orthogonal grid lines for locating the element, which comprises:

an opaque pad having means for defining a reference point on the pad, said defining means being incapable of passing significant quantities of illumination, and having two sets of indicators, each set of indicators being located at ends of a line through the reference point on the pad, and the location line of each set being orthogonal to the line of the other set, for aligning the pad with respect to the orthogonal grid lines, the means for defining the reference point on the pad being a rectangular aperture through the pad, and each set of indicators consisting of the opposite corners of the aperture; and means for attaching the pad to the base sheet to form an art master.

5. An element as defined in claim 4 where there is a window mounted in the aperture which is transparent to one color of light and opaque to all other colors of light.

6. An element for attachment to an art master base sheet having orthogonal grid lines for locating the element, which comprises:

an opaque pad having means for defining a reference point on the pad, said defining means being incapable of passing significant quantities of illumination, and having two sets of indicators, each set of indicators being located at ends of a line through the reference point on the pad, and the location line of each set being orthogonal to the line of the other set, for aligning the pad with respect to the orthogonal grid lines, each indicator being a V-shaped modification of the periphery of the pad; and means for attaching the pad to the base sheet to form an art master.

7. An element as defined in claim 6 wherein the means for defining the reference point on the pad comprises a small aperture through the pad.

8. An element as defined in claim 6 wherein the apex of eachV-shaped indicator is pointed toward the reference point on the pad.

9. An element as defined in claim 6 wherein the apex of each V-shaped indicator is pointed away from the reference point on the pad.

* * * * *